United States Patent
Sugimoto

(10) Patent No.: US 7,564,121 B2
(45) Date of Patent: Jul. 21, 2009

(54) SEMICONDUCTOR DEVICE HAVING SHIELD STRUCTURE

(75) Inventor: Sadayuki Sugimoto, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 492 days.

(21) Appl. No.: 11/520,554

(22) Filed: Sep. 13, 2006

(65) Prior Publication Data

US 2007/0069375 A1    Mar. 29, 2007

(30) Foreign Application Priority Data

Sep. 27, 2005    (JP)    ............... 2005-279397

(51) Int. Cl.
*H01L 23/552* (2006.01)
*H01L 23/34* (2006.01)

(52) U.S. Cl. ............... 257/659; 257/660; 257/723; 257/724

(58) Field of Classification Search .......... 257/659, 257/660, 723, 724
See application file for complete search history.

(56) References Cited

U.S. PATENT DOCUMENTS 5,808,595 A * 9/1998 Kubota et al. ............... 345/92
6,906,416 B2 * 6/2005 Karnezos .................... 257/723

FOREIGN PATENT DOCUMENTS

JP    2005-142466 A    6/2005

* cited by examiner

*Primary Examiner*—Luan C Thai
(74) *Attorney, Agent, or Firm*—Frishauf, Holtz, Goodman & Chick, P.C.

(57) ABSTRACT

A semiconductor device of the present invention has a base plate, a digital circuit section provided on a side of an upper surface of the base plate and having a plurality of external connection electrodes, an insulating layer provided on the base plate around the digital circuit section and on the digital circuit section, a plurality of upper conductive layers provided on the insulating layer and connected to the external connection electrodes of the digital circuit section, a plurality of lower conductive layers provided on a side of a lower surface of the base plate, an upper and lower conducting portion which penetrates the base plate and the insulating layer and connects at least one of the upper conductive layers with at least one of the lower conductive layers, an analog circuit section connected to at least one of the upper conductive layers and one of the lower conductive layers, and a shield cover covering the analog circuit section.

14 Claims, 2 Drawing Sheets

SEMICONDUCTOR DEVICE HAVING SHIELD STRUCTURE

BACKGROUND OF THE INVENTION

1. Field of the Invention

The present invention relates to a semiconductor device having a shield structure. More particularly, the present invention relates to a semiconductor device having an analog circuit section and a digital circuit section, and further having a shield structure for shielding the analog circuit section.

2. Description of the Related Art

As a semiconductor device suitable for high-density mounting, a WLP (Wafer Level Package) is known. A WLP is a semiconductor device obtained by forming bump electrodes for external connection on connection pads connected to the respective semiconductor integrated circuits on a wafer while the circuits are still on the wafer, filling a sealing agent between the bump electrodes, thereafter dicing the wafer. Each WLP has the same area as that of the semiconductor substrate obtained by dicing. Accordingly, even though each WLP is a packaged semiconductor device, the mounting density of the WLPs has been greatly improved. However, generally, in a case where the integrated circuits to be mounted are to be mounted with a super high density, it is difficult to use WLPs as such integrated circuits. This is because the pitch between the external connection electrodes becomes short. A semiconductor device described below, which is reduced in such difficulty, is now available. This semiconductor device is obtained by adhering each WLP on a base substrate having a larger area than that of the WLP, forming an insulating layer on the WLP and on the base substrate, forming a wire on the insulating layer so as to be connected to the electrode of the WLP, and forming an external connection electrode on the pad of the wire. If mounted on such a semiconductor device, the area of each WLP can be enlarged. Consequently, the pitch between the external connection electrodes can be increased, and the above-described difficulty can be reduced. Furthermore, a semiconductor layer in which a plurality of semiconductor devices form a stacked structure is now studied. Unexamined Japanese Patent Application KOKAI Publication No. 2005-142466 discloses a semiconductor device described below. This semiconductor device is obtained by placing a semiconductor component having a columnar electrode on its semiconductor substrate on a base plate having a larger plan-view size than that of the semiconductor component, forming an insulating layer on the base plate that appears around the semiconductor component, forming an upper insulation film on the semiconductor component and on the insulating layer, forming an upper wire on the upper insulation film so as to be connected to the columnar electrode of the semiconductor component, forming a solder ball on the connection pad portion of the upper wire, forming a lower wire under the base plate so as to be electrically connected to the upper wire through an upper and lower conducting portion, and mounting another semiconductor component under the connection pad portions of the lower wire.

Such a semiconductor device as described above has the following problem. In a case where a digital circuit section is constituted by a semiconductor component enclosed with an insulating member such as an insulating layer and an analog circuit section is constituted by another semiconductor component which is exposed to the outside, radiation noise from the digital circuit section interferes with the analog circuit section.

SUMMARY OF THE INVENTION

Hence, an object of the present invention is to provide a semiconductor device capable of reducing interference given on the analog circuit section by radiation noise from the digital circuit section.

To achieve the above object, a semiconductor device according to the present invention comprises: a base plate; a digital circuit section provided on a side of an upper surface of the base plate and having a plurality of external connection electrodes; an insulating layer provided on the base plate around the digital circuit section, and on the digital circuit section; a plurality of upper conductive layers provided on the insulating layer and connected to the external connection electrodes of the digital circuit section; a plurality of lower conductive layers provided on a side of a lower surface of the base plate; an upper and lower conducting portion which penetrates the base plate and the insulating layer and connects at least one of the upper conductive layers with at least one of the lower conductive layers; an analog circuit section connected to at least one of the upper conductive layers and one of the lower conductive layers; and a shield cover covering the analog circuit section.

According to the present invention, since the analog circuit section is covered by the shield cover, it is possible to reduce interference given to the analog circuit section by radiation noise from the digital circuit section.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Figure 1:
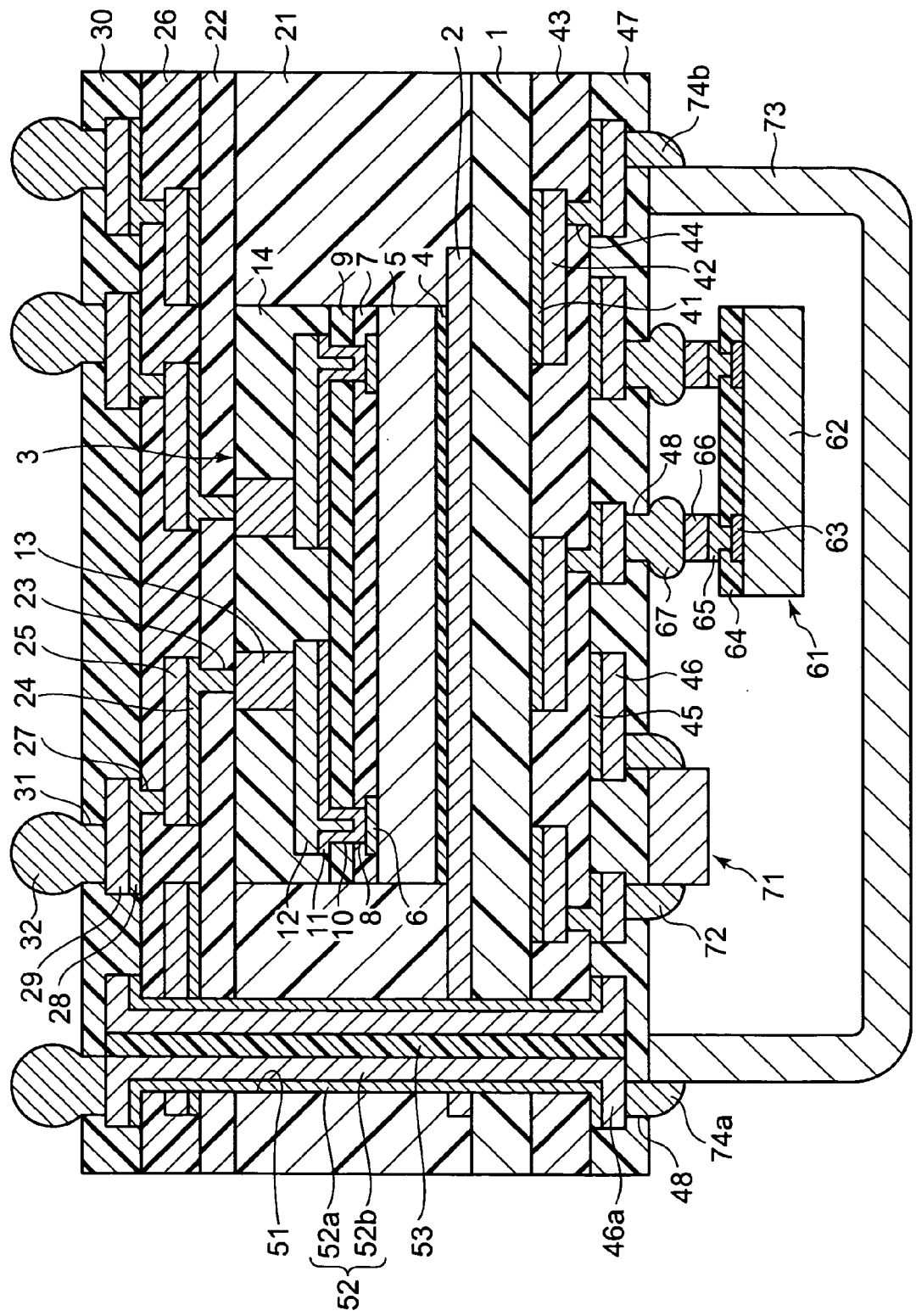
FIG. 1 is a cross sectional view of a semiconductor device as a first embodiment of the present invention.

FIG. 1 shows a cross sectional view of a semiconductor device as a first embodiment of the present invention. The semiconductor device comprises a base plate 1 made of glass fabric epoxy resin or the like and having a square plan-view shape. A ground layer 2 made of copper foil is formed flatly on the upper surface of the base plate 1. The lower surface of a semiconductor component 3 is adhered to the upper surface of the ground layer 2 via an adhesive layer 4 formed of a die bonding member. The semiconductor component 3 has a square plan-view shape which is smaller by some degree than the size of the base plate 1.

The semiconductor component 3 is a so-called CSP (Chip Size Package). The semiconductor component 3 comprises a silicon substrate (semiconductor substrate) 5. The lower surface of the silicon substrate 5 is adhered to the upper surface of the ground layer 2 via the adhesive layer 4. An integrated circuit section (unillustrated) having a predetermined function is formed on the upper surface of the silicon substrate 5. A plurality of connection pads 6 made of aluminum metal or the like are formed on the peripheral portion of the upper surface of the silicon substrate 5 so as to be connected to the integrated circuit section. This integrated circuit section is a digital integrated circuit section formed of a TTL (Transistor-Transistor Logic) or a C-MOS (Complementary-Metal Oxide Semiconductor).

An insulation film 7 made of silicon oxide or the like is formed on the upper surface of the silicon substrate 5 except the center portion of the connection pads 6. The center portion of each connection pad 6 is exposed in an opening portion 8 formed in the insulation film 7. A protective film 9 made of polyimide resin or the like is formed on the upper surface of the insulation film 7. In this case, opening portions 10 are formed in the protective film 9 at portions corresponding to the opening portions 8 in the insulation film 7.

Metallic base layers 11 made of copper or the like are formed on the upper surface of the protective film 9. Wires 12 made of copper are formed on the entire upper surface of the metallic base layers 11. One end portion of each wire 12, together with the metallic base layer 11, is connected to the connection pad 6 through the opening portions 10 and 8 in the protective film 9 and insulation film 7.

Columnar electrodes (external connection electrodes) 13 made of copper are formed on the upper surface of the connection pad portions of the wires 12. A sealing film 14 made of epoxy resin or the like is formed on the upper surface of the protective film 9 and on the upper surface of the wires 12, between the columnar electrodes 13. The sealing film 14 is formed such that its upper surface is level with the upper surface of the columnar electrodes 13.

An insulating layer 21 having a square frame shape is formed on the upper surface of the base plate 1 and upper surface of the ground layer 2 that appear around the semiconductor component 3. The insulating layer 21 is made of thermosetting resin such as epoxy resin, polyimide resin, etc. in which a reinforcing member made of an inorganic material such as a silica filler, etc. is diffused. Alternatively, the insulating layer 21 is made only of thermosetting resin such as epoxy resin, etc.

A first upper insulation film 22 is formed on the upper surface of the semiconductor component 3 and upper surface of the insulating layer 21. The upper surface of the first upper insulation film 22 is flattened. The first upper insulation film 22 is made of a base material made of glass fabric, glass fiber, or the like, into which thermosetting resin such as epoxy resin, polyimide resin, etc. is impregnated. Alternatively, the first upper insulation film 22 is made only of thermosetting resin such as epoxy resin, etc.

Opening portions 23 are formed in the first upper insulation film 22 at the portions corresponding to the center portions of the upper surfaces of the respective columnar electrodes 13 of the semiconductor component 3. First upper metallic base layers 24 are formed on the upper surface of the first upper insulation film 22. The first upper metallic base layers 24 are made of copper or the like. First upper wires 25 are formed on the entire upper surface of the first upper metallic base layers 24. The first upper wires 25 are made of copper. The first upper metallic base layers 24 and first upper wires 25 are connected to the upper surface of the columnar electrodes 13 of the semiconductor component 3 through the opening portions 23 in the first upper insulation film 22.

A second upper insulation film 26 is formed on the upper surface of the first upper wires 25 and upper surface of the first upper insulation film 22. The second upper insulation film 26 is made of the same material as that of the first upper insulation film 22. The upper surface of the second upper insulation film 26 is flattened. Opening portions 27 are formed in the second upper insulation film 26 at the portions corresponding to at least a part of the connection pad portions of the respective first upper wires 25.

Second upper metallic base layers 28 are formed on the upper surface of the second upper insulation film 26. The second upper metallic base layers 28 are made of copper or the like. Second upper wires 29 are formed on the entire upper surface of the second upper metallic base layers 28. The second upper wires 29 are made of copper. The second upper metallic base layers 28 and second upper wires 29 are connected to the connection pad portions of the first upper wires 25 through the opening portions 27 formed in the second upper insulation film 26.

An uppermost insulation film 30 made of solder resist or the like is formed on the upper surface of the second upper insulation film 26 and upper surface of the second upper wires 29. Opening portions 31 are formed in the uppermost insulation film 30 at the portions corresponding to the connection pad portions of the second upper wires 29. Solder balls 32 are formed in and above the opening portions 31, so as to be connected to the connection pad portions of the upper wires 29.

First lower metallic base layers 41 are formed on the lower surface of the base plate 1. The first lower metallic base layers 41 are made of copper or the like. First lower wires 42 are formed on the entire lower surface of the first lower metallic base layers 41. The first lower wires 42 are made of copper. A lower insulation film 43 is formed on the lower surface of the base plate 1 and lower surface of the first lower wires 42, such that the lower surface of the lower insulation film 43 is flattened. The lower insulation film 43 is made of the same material as that of the first upper insulation film 22. Opening portions 44 are formed in the lower insulation film 43 at the portions corresponding to the connection pad portions of the first lower wires 42.

Second lower metallic base layers 45 are formed on the lower surface of the lower insulation film 43. The second lower metallic base layers 45 are made of copper or the like. Second lower wires 46 are formed on the entire lower surface of the second lower metallic base layers 45. The second lower wires 46 are made of copper. The second lower metallic base layers 45 and second lower wires 46 are connected to the connection pad portions of the first lower wires 42 through the opening portions 44 in the first lower insulation film 43.

A lowermost insulation film 47 made of solder resist or the like is formed on the lower surface of the lower insulation film 43 and lower surface of the second lower wires 46. Opening portions 48 are formed in the lowermost insulation film 47 at the portions corresponding to the connection pad portions of the second lower wires 46.

The pair of the second upper metallic base layers 28 and second upper wires 29 and the pair of the second lower metallic base layers 45 and second lower wires 46 are connected through an upper and lower conducting portion 52. The upper and lower conducting portion 52 is formed along the inner wall of a through hole 51. The through hole 51 is formed at a predetermined portion throughout the second upper insulation film 26, the first upper insulation film 22, the insulating layer 21, the ground layer 2, the base plate 1, and the lower insulation film 43. The upper and lower conducting portion 52 comprises a metallic base layer 52a made of copper or the like, and a copper layer 52b. In this case, the ground layer 2 is electrically connected to the upper and lower conducting portion 52. A filling member 53 made of solder resist or the like is filled in the upper and lower conducting portion 52.

Two electronic components are mounted under the lowermost insulation film 47. The two electronic components are a semiconductor component 61 having an analog integrated circuit section including an integrated circuit element such as an FET (Field Effect Transistor), etc., and a chip component 71 constituted by a capacitor, a resistor, etc.

The semiconductor component 61 is generally called bare chip. The semiconductor component 61 is structured such that a plurality of connection pads 63 are formed on the peripheral portions of the upper surface of a silicon substrate 62, an insulation film 64 made of silicon oxide or the like is formed on the upper surface of the silicon substrate 62 except the center portions of the connection pads 63, metallic base layers 65 made of copper or the like and protruding electrodes 66 made of copper are formed on the upper surface of the insulation film 64 so as to be connected to the connection pads 63, and solder balls 67 are formed on the protruding electrodes 66.

The semiconductor component 61 is mounted under the lowermost insulation film 47 in a state that the solder balls 67 thereof are bonded to the lower surface of the connection pad portions of the second lower wires 46 through the opening portions 48 in the lowermost insulation film 47. The chip component 71 is mounted under the lowermost insulation film 47 in a state that its electrodes on both sides (unillustrated) are bonded to the lower surface of the connection pad portions of the second lower wires 46 through solders 72 and the opening portions 48 in the lowermost insulation film 47.

A shield cover 73 made of metal is formed under the lowermost insulation film 47 so as to cover the semiconductor component 61 and the chip component 71. In this case, plural portions at the upper ends of the shield cover 73 are adhered and electrically connected, by a solder 74*a* and a solder 74*b*, to the lower surface of the connection pad portion of a second lower wire 46*a* for a grounding purpose, and to the second lower wire 46 through the opening portions 48 in the lowermost insulation film 47.

Like this, in the present semiconductor device, chip component 71 and the semiconductor component 61 constituting the analog integrated circuit section are covered with the shield cover 73. Accordingly, it is possible to reduce interference given on chip component 71 and the semiconductor component 61 constituting the analog circuit section, due to radiation noise from the semiconductor component 3 constituting the digital integrated circuit section. The shield cover 73 may be such one as having a conducting film on the surface of a resin cover.

Second Embodiment

Figure 2:
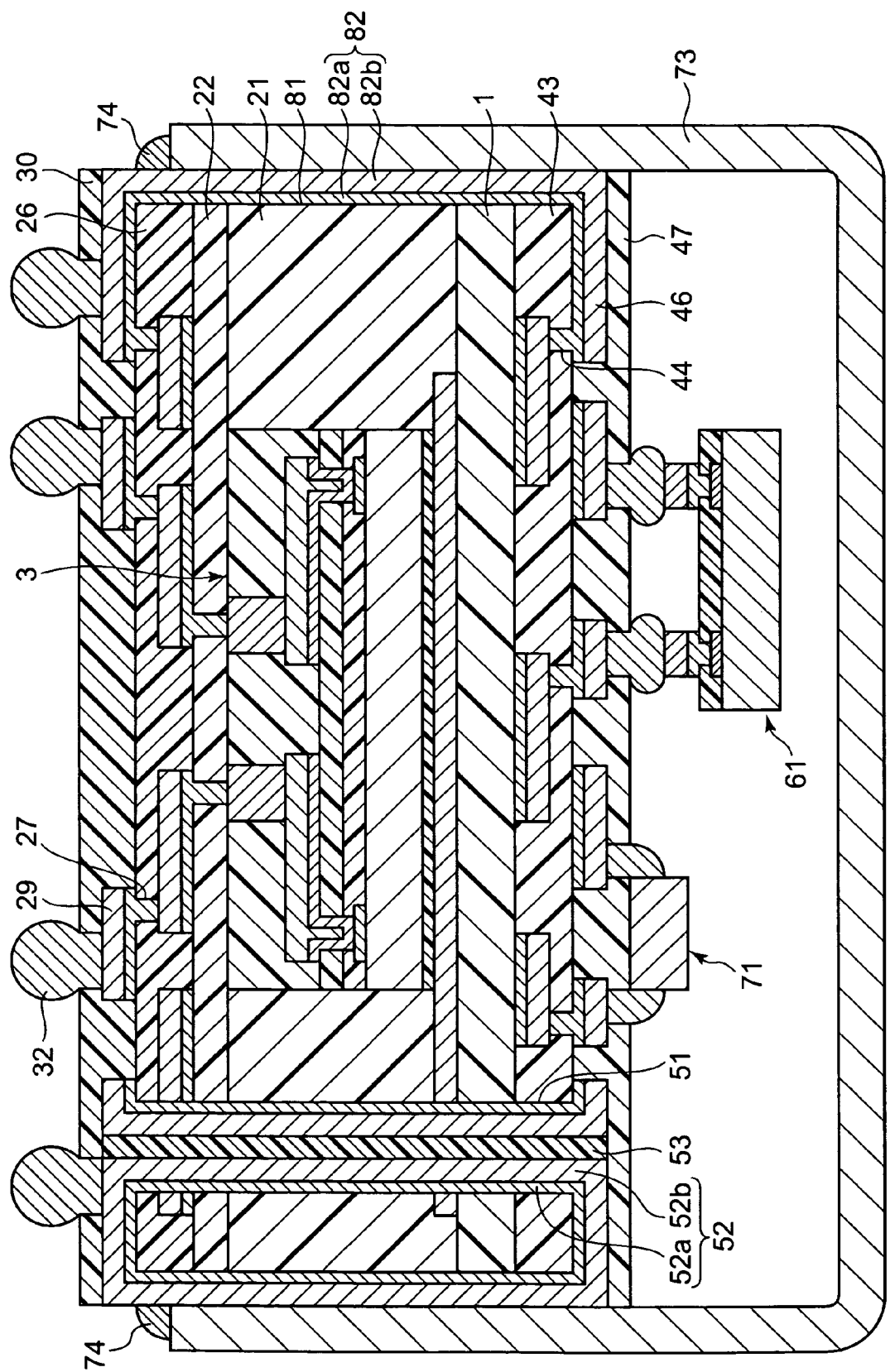
FIG. 2 is a cross sectional view of a semiconductor device as a second embodiment of the present invention.

FIG. 2 shows a cross sectional view of a semiconductor device as a second embodiment of the present invention. The great difference between the present semiconductor device and the semiconductor device shown in FIG. 1 is that in the present semiconductor device, the side surfaces of at least the first upper insulation film 22, insulating layer 21, base plate 1, lower insulation film 43, and lowermost insulation film 47 are covered by the shield cover 73.

In this case, a through hole 81 having a semicircular plan-view shape is formed at predetermined plural portions on the side surfaces of the second upper insulation film 26, first upper insulation film 22, insulating layer 21, base plate 1, lower insulation film 43, and lowermost insulation film 47. A side-surface upper and lower conducting portion 82 for a grounding purpose, which comprises a metallic base layer 82*a* made of copper or the like and a copper layer 82*b*, is formed in the through hole 81. Predetermined plural portions at the upper end surfaces of the shield cover 73 are adhered, via solders 74, to the side-surface upper and lower conducting portion 82 for the grounding purpose.

Here, one example of a forming method of the side-surface upper and lower conducting portion 82 for the grounding purpose will be briefly explained. First, a base plate 1 having an area on which a plurality of the completed semiconductor device shown in FIG. 2 can be formed is prepared. After the second upper insulation film 26 is formed above the base plate 1 and the lower insulation film 43 is formed under the base plate 1, the through holes 51 and 81 are formed so as to penetrate the second upper insulation film 26, the first upper insulation film 22, the insulating layer 21, the base plate 1, and the lower insulation film 43. Then, the opening portions 27 and 44 are formed in the second upper insulation film 26 and lower insulation film 43 respectively.

Next, a metallic base layer formed of copper or the like is formed in the through holes 51 and 81. A metallic base layer made of copper or the like is formed on the entire surface of the second upper insulation film 26 and on the entire surface of the lower insulation film 43. Then, the second upper wires 29 and the second lower wires 46 are formed by copper electrolytic plating using the formed metallic base layer as the plating current path. Likewise, the copper layer 52*b* in the through hole 51 and the copper layer 82*b* in the through hole 81 are formed. Next, unnecessary portions of the metallic base layers are etched out with the second upper wires 29, the second lower wires 46, and the copper layers 52*b* and 82*b* used as masks.

Next, the uppermost insulation film 30 and the lowermost insulation film 47 are formed by using solder resist or the like. Simultaneously, the filling member 53 made of solder resist or the like is filled in the through hole 51. Next, the solder balls 32 are formed. Then, the uppermost insulation film 30, the second upper layer insulation film 26, the first upper insulation film 22, the insulating layer 21, the base plate 1, the lower insulation film 43, and the lowermost insulation film 47 are severed along the center axis of the through hole 81. By this severing, the through hole 81 is formed into a cylinder having a generally semicircular plan-view shape. After this, in a state that the shield cover 73 is in intimate contact with the side surface of the cylindrical through hole 81, an upper end of the shield cover is adhered and electrically connected to the copper layer 82*b*, thus completing the device shown in FIG. 2.

Other Embodiments

In the above-described embodiments, a case has been explained that the semiconductor balls 32 are formed on the uppermost insulation film 30, and the semiconductor component 61 and chip component 71 are mounted under the lowermost insulation film 47. Contrary to this, the semiconductor component 61 and chip component 71 may be mounted on the uppermost insulation film 30, and the solder balls 32 may be formed under the lowermost insulation film 47. Further, the semiconductor component 61 may have a similar structure to that of the semiconductor component 3.

In the above-described embodiments, the ground layer 2 is formed on the upper surface of the base plate 1. This is not the only case, but the ground layer 2 may be formed on the lower surface of the base plate 1 or may be formed on both the upper and lower surfaces of the base plate 1. In a case where the ground layer 2 is formed on the lower surface of the base plate 1, a lower insulation film is formed between the base plate 1 including the ground layer 2, and the first lower metallic base layer 41.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2005-279397 filed on Sep. 27, 2005 and including specification, claims, drawings and summary. The disclosure of the above Japanese Patent Application is incorporated herein by reference in its entirety.

What is claimed is:

1. A semiconductor device, comprising:
a base plate;
a digital circuit section provided on a side of an upper surface of the base plate and having a plurality of external connection electrodes;
an insulating layer provided on the base plate around the digital circuit section, and on the digital circuit section;
a plurality of upper conductive layers provided on the insulating layer and connected to the external connection electrodes of the digital circuit section;
a plurality of lower conductive layers provided on a side of a lower surface of the base plate;
an upper and lower conducting portion which penetrates the base plate and the insulating layer and connects at least one of the upper conductive layers with at least one of the lower conductive layers;
an analog circuit section connected to at least one of the upper conductive layers and one of the lower conductive layers; and
a shield cover covering the analog circuit section.

2. The semiconductor device according to claim 1, wherein the digital circuit section includes a semiconductor component having a digital integrated circuit section.

3. The semiconductor device according to claim 2, wherein the semiconductor component includes a semiconductor substrate having the digital integrated circuit section, connection pads connected to the digital integrated circuit section, a protective film having opening portions in which the connection pads formed on the semiconductor substrate are exposed, and the external connection electrodes having a column shape and connected to the connection pads respectively.

4. The semiconductor device according to claim 3, wherein the semiconductor component further includes wires for connecting the connection pads with the external connection electrodes and formed on the protective film.

5. The semiconductor device according to claim 1, wherein the analog circuit section includes a semiconductor component having an analog integrated circuit section.

6. The semiconductor device according to claim 5, wherein the semiconductor component includes a semiconductor substrate having the analog integrated circuit section, connection pads connected to the analog integrated circuit section, an insulation film formed on the semiconductor substrate and having opening portions in which the connection pads are exposed, and external connection electrodes having a protruding shape and connected to the connection pads respectively.

7. The semiconductor device according to claim 1, wherein the analog circuit section includes a semiconductor component and a passive electronic component.

8. The semiconductor device according to claim 1, wherein the conductive layers to which the shield cover is connected are connected to a ground potential.

9. The semiconductor device according to claim 6, wherein the shield cover is soldered to the upper and lower conducting portion.

10. The semiconductor device according to claim 1, wherein the shield cover is formed at the side of the lower surface of the base plate so as to cover a surrounding of the analog circuit section.

11. The semiconductor device according to claim 1, wherein the upper and lower conducting portion is formed on a side surface of the base plate and a side surface of the insulating layer so as to be exposed to an outside.

12. The semiconductor device according to claim 11, wherein the shield cover is soldered to the upper and lower conducting portion formed on the side surface of the base plate and the side surface of the insulating layer.

13. The semiconductor device according to claim 12, wherein the upper and lower conducting portion is a cylindrical groove having a generally semicircular plan-view shape.

14. A semiconductor device, comprising:
a first semiconductor component including a semiconductor substrate having a plurality of connection pads formed thereon, a protective film having opening portions for exposing the connection pads, and a plurality of columnar electrodes connected to the connection pads respectively;
a first wiring construct provided on one surface of the first semiconductor construct including a first insulating layer and a plurality of first wires carried on the first insulating layer;
a second wiring construct provided on the other surface opposite to the one surface of the first semiconductor construct including a second insulating layer and a plurality of second wires carried on the second insulating layer;
a vertical conducting portion which connect at least one of the first wires of the first wiring construct with one of the second wires of the second wiring construct;
a second semiconductor component connected at least one of the first wires of the first wiring construct and the second wires of the second wiring construct; and
a shield cover enclosing the second semiconductor component.

* * * * *